United States Patent
Zhao (10) Patent No.: US 10,211,238 B2
(45) Date of Patent: Feb. 19, 2019

(54) FLEXIBLE DISPLAY MOTHERBOARD AND MANUFACTURING METHOD OF FLEXIBLE DISPLAY PANEL

(71) Applicant: BOE TECHNOLOGY GROUP CO., LTD., Beijing (CN)

(72) Inventor: Jinrong Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/533,816

(22) PCT Filed: Mar. 7, 2016

(86) PCT No.: PCT/CN2016/075798
§ 371 (c)(1),
(2) Date: Jun. 7, 2017

(87) PCT Pub. No.: WO2016/188180
PCT Pub. Date: Dec. 1, 2016

(65) Prior Publication Data
US 2017/0373100 A1    Dec. 28, 2017

(30) Foreign Application Priority Data
May 26, 2015 (CN) .......................... 2015 1 0276605

(51) Int. Cl.
*B32B 43/00* (2006.01)
*H01L 27/12* (2006.01)
(Continued)

(52) U.S. Cl.
CPC .......... *H01L 27/1266* (2013.01); *B32B 37/14* (2013.01); *B32B 43/006* (2013.01);
(Continued)

(58) Field of Classification Search
CPC .............. C09J 2205/302; B32B 43/006; Y10T 156/1111; Y10T 156/1116; Y10S 156/924
See application file for complete search history.

(56) References Cited

U.S. PATENT DOCUMENTS 5,269,868 A * 12/1993 Gofuku ............... B29C 63/0013
156/272.8
6,821,376 B1 * 11/2004 Rayssac ............ H01L 21/67092
156/382

(Continued)

FOREIGN PATENT DOCUMENTS

CN    101649068 A  *  2/2010
CN    102610700 A     7/2012

(Continued)

OTHER PUBLICATIONS

English Machine Translation CN101649068A, Google Patents.*
International search Report dated Jun. 14, 2016.
First Chinese Office Action dated Jul. 4, 2017.

*Primary Examiner* — Mark A Osele
(74) *Attorney, Agent, or Firm* — Dilworth & Barrese, LLP; Michael J. Musella, Esq.

(57) ABSTRACT

A flexible display motherboard and a manufacturing method thereof are provided. The flexible display motherboard includes a carrier substrate and a flexible display panel unit formed thereon. The flexible display panel unit includes a flexible base formed on the carrier substrate, and a display region and a periphery region which are positioned on the flexible base. A display device is formed in the display region, and the periphery region surrounds the display region. The flexible display panel unit further includes a dissolvable layer positioned between the carrier substrate and the flexible base. The dissolvable layer is formed at least in an area corresponding to the display region. The dissolvable layer is dissolvable in a solvent.

14 Claims, 5 Drawing Sheets

(51) Int. Cl.
*H01L 21/683* (2006.01)
*B32B 37/14* (2006.01)
*H01L 21/77* (2017.01)
*H01L 21/78* (2006.01)

(52) U.S. Cl.
CPC .......... *H01L 21/6835* (2013.01); *H01L 27/12* (2013.01); *H01L 27/1218* (2013.01); *B32B 2307/304* (2013.01); *B32B 2309/105* (2013.01); *B32B 2457/20* (2013.01); *H01L 21/77* (2013.01); *H01L 21/78* (2013.01); *H01L 2221/68345* (2013.01); *H01L 2221/68381* (2013.01); *Y10S 156/924* (2013.01); *Y10T 156/1111* (2015.01); *Y10T 156/1116* (2015.01)

(56) References Cited

U.S. PATENT DOCUMENTS

| | | | | |
|---|---|---|---|---|
| 8,443,864 | B2* | 5/2013 | Thallner | H01L 21/67092 |
| | | | | 156/703 |
| 8,657,994 | B2* | 2/2014 | Burrows | H01L 21/67086 |
| | | | | 156/703 |
| 8,771,456 | B2* | 7/2014 | Shimizu | H01L 21/6835 |
| | | | | 156/247 |
| 9,318,475 | B2* | 4/2016 | Bibl | G09F 9/301 |
| 2003/0021571 | A1* | 1/2003 | Lian | G02B 6/12002 |
| | | | | 385/137 |
| 2004/0188427 | A1* | 9/2004 | Huang | B29C 33/02 |
| | | | | 219/667 |
| 2006/0183625 | A1 | 8/2006 | Miyahara | |
| 2010/0124795 | A1 | 5/2010 | Eguchi | |
| 2011/0141448 | A1 | 6/2011 | Aoki et al. | |
| 2013/0077033 | A1 | 3/2013 | Li | |
| 2015/0325465 | A1* | 11/2015 | Iwata | B32B 38/1858 |
| | | | | 156/703 |
| 2015/0348818 | A1* | 12/2015 | Tachioka | H01L 21/6835 |
| | | | | 156/247 |

FOREIGN PATENT DOCUMENTS

| | | |
|---|---|---|
| CN | 102769109 A | 11/2012 |
| CN | 102810512 A | 12/2012 |
| CN | 103325731 A | 9/2013 |
| CN | 103474583 A | 12/2013 |
| CN | 104064685 A | 9/2014 |
| CN | 104992944 A | 10/2015 |
| KR | 20120105244 A | 9/2012 |
| WO | 2014031372 A1 | 2/2014 |

* cited by examiner

FLEXIBLE DISPLAY MOTHERBOARD AND MANUFACTURING METHOD OF FLEXIBLE DISPLAY PANEL

TECHNICAL FIELD

Embodiments of the present disclosure relate to a flexible display motherboard and a manufacturing method of flexible display panel.

BACKGROUND

With the development of display technology, flexible display devices are widely used. Since the flexible display panel adopts a flexible base, the flexible display panel is conventionally manufactured by typically using a carrier substrate as a carrier carrying the flexible base, forming a display device on the flexible base and finally separating the flexible base from the carrier substrate so as to obtain the flexible display panel.

Figure 1:
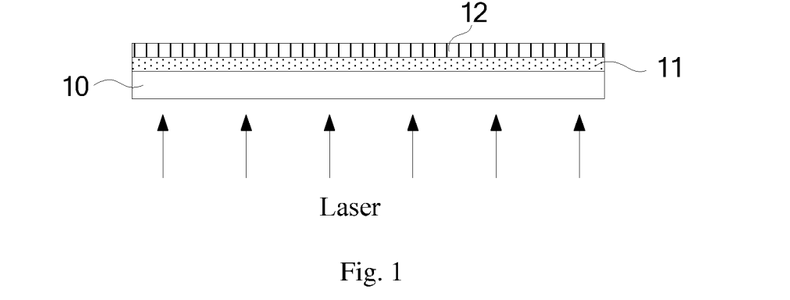
FIG. 1 is an illustrative view of laser-peeling a flexible display base in the conventional arts.

As shown in FIG. 1, a flexible base 11 is formed on a carrier substrate 10 and then a display device 12 is formed on the flexible base 11. Finally, the flexible base 11 is separated from the carrier substrate 10, thereby obtaining a flexible display panel comprising the flexible base.

In conventional arts, there are two main technologies for separating the flexible base from the carrier substrate, i.e., mechanical separation and laser separation. Mechanical separation refers to cutting off the flexible base from the carrier substrate by a cutter or the like so that the flexible base is separated from the carrier substrate. Defects mainly caused by such process comprises a great quantity of micro-particles, incomplete peeling and serious damage to the flexible base. As shown in FIG. 1, laser separation refers to separating the flexible base from the carrier substrate through laser irradiation. Compared with mechanical peeling, laser peeling has advantages of few micro-particles, high process precision and higher yield. However, at present, laser separation has the following problems: 1. high heat during laser irradiation might cause a carbonization in an irradiated region of the substrate, thereby affecting the transmittance of the substrate; 2. during laser irradiation, the substrate is penetrated and the thin film transistor in the display region is irradiated, thereby causing a threshold voltage drift and the like, and further degrading the performance of the thin film transistor.

SUMMARY

At least one embodiments of the present disclosure provides a flexible display motherboard and a manufacturing method thereof. Forming a flexible display panel from the flexible display motherboard, damage to a flexible base can be mitigated when separating the flexible base from the carrier substrate.

At least one embodiments of the present disclosure provides a flexible display motherboard, comprising a carrier substrate and a flexible display panel unit formed on the carrier substrate, wherein the flexible display panel unit comprises a flexible base formed on the carrier substrate, and a display region and a periphery region which are positioned on the flexible base, a display device is formed in the display region, and the periphery region surrounds the display region; wherein the flexible display motherboard further comprises a dissolvable layer positioned between the carrier substrate and the flexible base, the dissolvable layer is formed at least in an area corresponding to the display region and is dissolvable in a solvent.

At least one embodiments of the present disclosure provides manufacturing method of a flexible display panel, the flexible display panel comprising a flexible base, and a display region and a periphery region which are positioned on the flexible base, the periphery region surrounding the display region, the method comprises:

forming a dissolvable layer at least in an area of a carrier substrate corresponding to the display region in which the flexible display panel is formed, wherein the dissolvable layer is dissolvable in a solvent;

forming the flexible base on the carrier substrate and a display device positioned in the display region, wherein the flexible base covers at least an upper surface of the dissolvable layer; and dissolving the dissolvable layer by the solvent.

The embodiments of the present disclosure provide a flexible display unit, which is formed on the carrier substrate and comprises a flexible base formed on the carrier substrate as well as a display region and a periphery region positioned on the flexible base, a display device is formed in the display region, and the periphery region surrounding the display region, wherein a dissolvable layer is formed between the flexible display motherboard and the flexible display panel unit in an area corresponding to the display region and the periphery region, when separating the flexible base from the carrier substrate, the dissolvable layer is dissolved by a solvent so that the entire flexible display panel is separated from the carrier substrate without mechanical peeling or laser irradiation, thereby avoiding any damage to the flexible base.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE SIGNS

10—carrier substrate; 11—flexible base; 12—display device; 13—dissolvable layer; 14—heat insulation layer; 15—protection layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

It is to be noted that, in order to realize mass production, a flexible display panel is manufactured typically by forming a plurality of flexible display panel units on a carrier substrate, i.e., a flexible display motherboard of the present disclosure, and then cutting the flexible display motherboard, thereby dividing into the respective flexible display panel units. In the embodiment of the present disclosure, a detailed description is made by taking one flexible display panel unit formed on the flexible display motherboard as an example.

Figure 2:
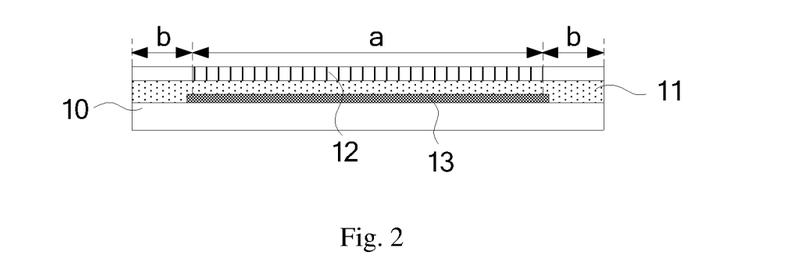
FIG. 2 is an illustrative view of a flexible display motherboard according to one embodiment of the present disclosure.

One embodiment of the present disclosure provides a flexible display motherboard, comprising a carrier substrate and a flexible display panel unit formed on the carrier substrate. As illustrated in FIG. 2, the flexible display panel unit comprises a flexible base 11, as well as a display region a and a periphery region b positioned on the flexible substrate. A display device 12 is formed in the display region a and the periphery region b surrounds the display region a. The flexible display motherboard further comprises a dissolvable layer 13 disposed between the carrier substrate 10 and the flexible base 11. The dissolvable layer 13 is formed at least in the area corresponding to the display region a and can be dissolved in a solvent.

It is to be noted that the flexible display panel unit comprises the display region and the periphery region which surrounds the display region, wherein the display region is formed with a display device such as TFT (Thin Film Transistor) and is configured to display an image, and the periphery region is usually configured to bond a circuit. The dissolvable layer is at least formed in the area corresponding to the display region. That is, the dissolvable layer can be formed either in an area corresponding to the display region, or in an area corresponding to the display region and the periphery region as illustrated in FIG. 2. The dissolvable layer can be dissolved in a solvent. That is to say, the dissolvable layer can be dissolved by a specific solution. The solvent is relevant to the material of the dissolvable layer. The embodiments of the present disclosure are described by exemplifying the dissolvable layer as epoxy resin. The epoxy resin can be dissolved in an epoxy resin solvent synthesized by dichloromethane, formic acid, phenol and sulfuric acid.

In a flexible display motherboard according to the embodiment of the present disclosure, the flexible display panel unit formed on the carrier substrate comprises a flexible base formed on the carrier substrate as well as a display region and a periphery region positioned on the flexible base. A display device is formed in the display region. A dissolvable layer is formed between the flexible display motherboard and the flexible display panel unit in an area corresponding to the display region and the periphery region. When separating the flexible base from the carrier substrate, the dissolvable layer is dissolved by a solvent so that the entire flexible display panel is separated from the carrier substrate without mechanical peeling or laser irradiation, thereby avoiding any damage to the flexible base.

In one embodiment of the present disclosure, the flexible display motherboard further comprises a heat insulation layer positioned between the dissolvable layer and the carrier substrate and/or a heat insulation layer positioned between the dissolvable layer and the flexible base. For example, the heat insulation layer can be only disposed between the dissolvable layer and the carrier substrate. Alternatively, the heat insulation layer can be only disposed between the dissolvable layer and the flexible base. Alternatively, the heat insulation layers 14 can be formed both between the dissolvable layer 13 and the flexible base 11 and between the dissolvable layer 13 and the carrier substrate 10, as illustrated in FIG. 2.

In one embodiment of the present disclosure, sum of the thicknesses of the dissolvable layer and the heat insulation layer is no greater than 5 microns. Therefore, the flexible base is relatively flat after the dissolvable layer is dissolved.

In one embodiment of the present disclosure, the heat insulation layer is formed by thermal insulation nanoporous material. The thermal insulation nanoporous material is built on the basis of low density and super-micropore structure and has a thermal conductivity theoretically close to zero. The thermal conductivity of the heat insulation layer formed by the thermal insulation nanoporous material is smaller than that of the air. For example, the heat insulation layer can be formed by thermal insulation nanoporous material of silicon oxide.

Figure 3:
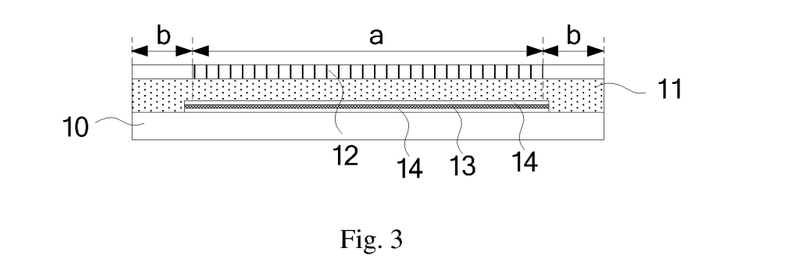
FIG. 3 is an illustrative view of a flexible display motherboard according to another embodiment of the present disclosure.

In one embodiment of the present disclosure, as illustrated in FIG. 2 and FIG. 3, the dissolvable layer 13 is formed in an area corresponding to the display region a and a part of the periphery region b. If the dissolvable layer is formed in an area corresponding to the display region, then at the time of separating the flexible base from the carrier substrate, the flexible base where no dissolvable layer is formed is peeled off by laser at first, and then the dissolvable layer is removed by a solution, so that the entire flexible display panel and the carrier substrate are separate from each other. Since the performance of the display device such as TFT in the display region would be affected when the display region is irradiated by laser, in one embodiment of the present disclosure, the dissolvable layer is formed in an area corresponding to the display region and a part of the periphery region, so that only the periphery region is irradiated by laser while the display region is not irradiated, thereby ensuring the performance of the display device in the display region.

To prevent the dissolvable layer from being eroded by other solutions during the preparation of the display device, in one embodiment of the present disclosure, sides of the dissolvable layer 13 are covered by the flexible base 11, as illustrated in FIG. 2 and FIG. 3.

Figure 4:
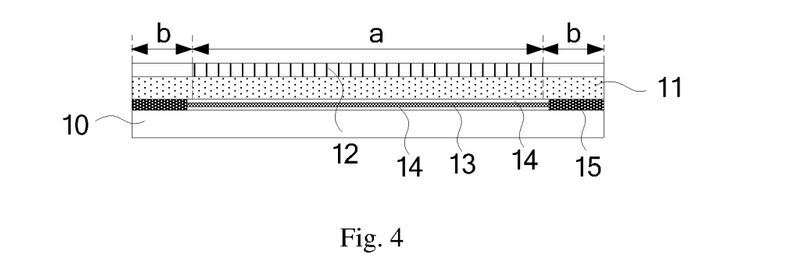
FIG. 4 is an illustrative view of a flexible display motherboard according to yet another embodiment of the present disclosure.

Alternatively, in one embodiment of the present disclosure, the flexible display motherboard further comprises a protection layer 15 which covers at least the sides of the dissolvable layer 13 as illustrated in FIG. 4. The protection layer covers the sides of the dissolvable layer, so as to prevent the dissolvable layer from being eroded by other solutions at the time of forming the display device. In one embodiment of the present disclosure, the protection layer only covers the sides of the dissolvable layer. In addition, in consideration of the variation of the manufacturing process, the protection layer can further cover a part of an upper surface of the dissolvable layer.

Figure 5:
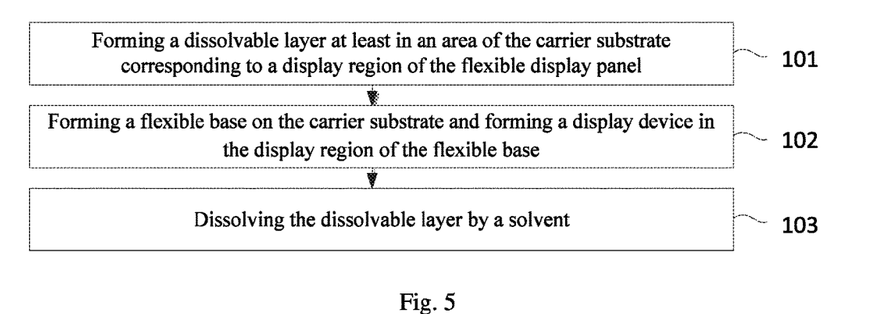
FIG. 5 is an illustrative view of a manufacturing method of flexible display panel according to one embodiment of the present disclosure.

At least one embodiment of the present disclosure provides a manufacturing method of flexible display panel. As illustrated in FIG. 5, the manufacturing method comprises:

A step 101 of forming a dissolvable layer at least in an area of the carrier substrate corresponding to a display region of the flexible display panel, wherein the dissolvable layer can be dissolved in a solvent.

For example, the dissolvable layer can be an epoxy resin. The epoxy resin is a thermosetting resin and can be cured by heating or baking.

The manufacturing method further comprises a step 102 of forming a flexible base on the carrier substrate and forming a display device in the display region of the flexible base, wherein the flexible base covers at least an upper surface of the dissolvable layer.

In one embodiment of the present disclosure, the dissolvable layer is formed in an area corresponding to the display region and the periphery region, and the flexible base covers the upper surface of the dissolvable layer.

In another embodiment of the present disclosure, the dissolvable layer is formed in an area corresponding to the display region and a part of the periphery region of the flexible display panel, the flexible base is formed on the carrier substrate and can cover the upper surface and the sides of the dissolvable layer.

The manufacturing method further comprises a step 103 of dissolving the dissolvable layer by a solvent.

The dissolvable layer is dissolved by the solvent, so that the flexible display panel is separated from the carrier substrate. The solvent can be varied depending on the materials of the dissolvable layer.

In the manufacturing method of flexible display panel according to the embodiment of the present disclosure, if the dissolvable layer is formed between the carrier substrate and the flexible base at the boundary of the display region and/or of the periphery region, then the dissolvable layer is dissolved by a solvent when separating the flexible base from the carrier substrate, so that the entire flexible display panel is separated from the carrier substrate without mechanical peeling or laser irradiation, thereby avoiding any damage to the flexible base.

Figure 6:
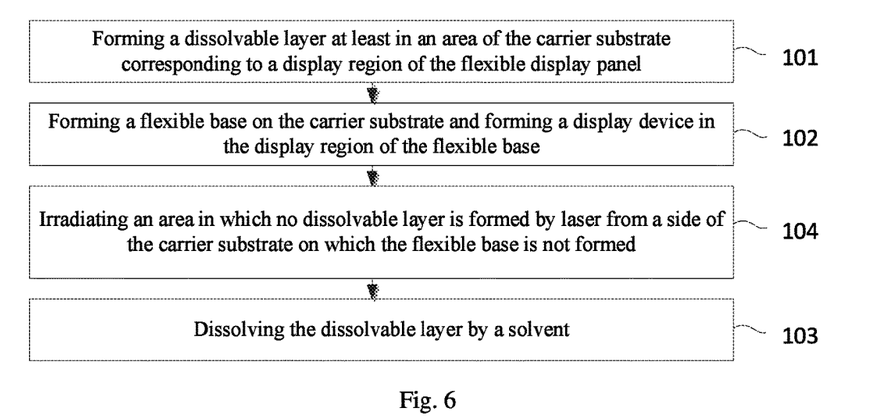
FIG. 6 is an illustrative view of a manufacturing method of flexible display panel according to another embodiment of the present disclosure.

In one embodiment of the present disclosure, the dissolvable layer is formed in an area corresponding to the display region and a part of the periphery region, and as illustrated in FIG. 6, after the step 102 and before the step 103, the method further comprises:

a step 104 of irradiating an area in which no dissolvable layer is formed by laser from a side of the carrier substrate on which the flexible base is not formed.

Figure 7:
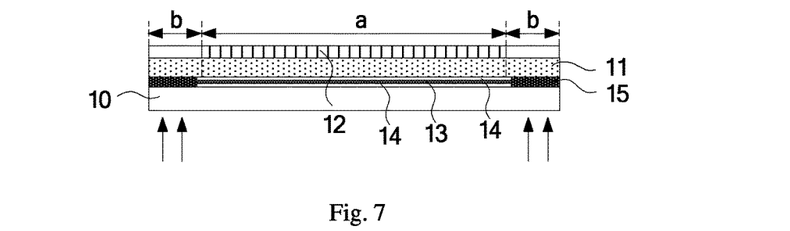
FIG. 7 is an illustrative view of irradiating an area of the flexible display panel in which no dissolvable layer is formed by laser.

As illustrated in FIG. 6, the area of the flexible display motherboard in which no dissolvable layer is formed is irradiated by laser, so that the flexible base in the area in which no dissolvable layer is formed becomes separated from the carrier substrate. The separation of the flexible base from the carrier substrate can be as illustrated in FIG. 7.

In the manufacturing method of flexible display panel according to the embodiment of the present disclosure, since a dissolvable layer is formed between the display region of the flexible base of the flexible display panel and the carrier substrate and is formed in an area corresponding to the display region and a part of the periphery region, and an area in which no dissolvable layer is formed corresponds to the periphery region, the area in which no dissolvable layer is formed is irradiated by laser so that the flexible base is separated from the carrier substrate and the solvent is allowed to be in contact with the dissolvable layer and dissolves the dissolvable layer, thereby separating the flexible base from the carrier substrate. Since the area in which no dissolvable layer is formed corresponds to the periphery region, only the periphery region is irradiated by laser while the display region is not irradiated, thereby ensuring the performance of the display device in the display region.

Figure 9:
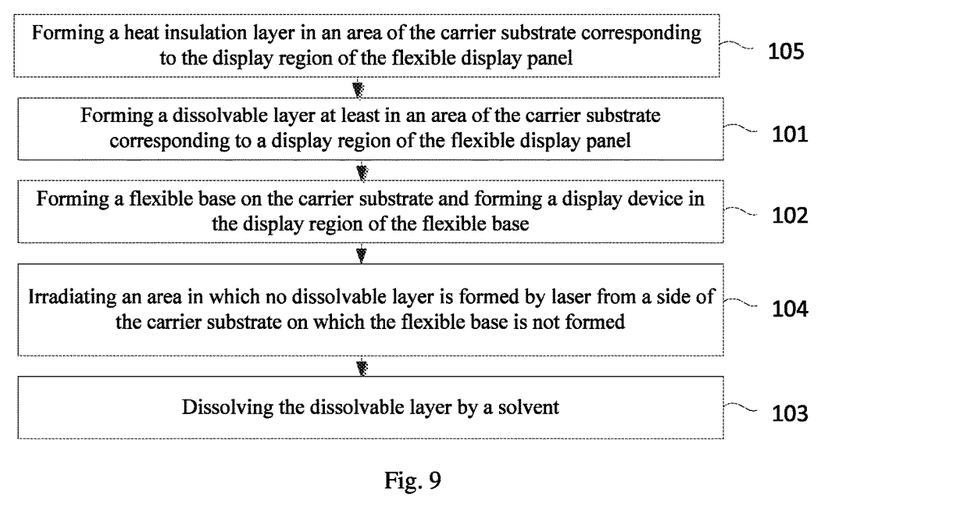
FIG. 9 is an illustrative view of a manufacturing method of flexible display panel according to another embodiment of the present disclosure.

In one embodiment of the present disclosure, as illustrated in FIG. 9, before the step 101, the manufacturing method further comprises:

a step 105 of forming a heat insulation layer in an area of the carrier substrate corresponding to the display region of the flexible display panel.

Thus, the step 101 can be forming a dissolvable layer on the heat insulation layer.

In this case, the thus-formed flexible display motherboard further comprises the heat insulation layer positioned between the dissolvable layer and the carrier substrate.

Figure 10:
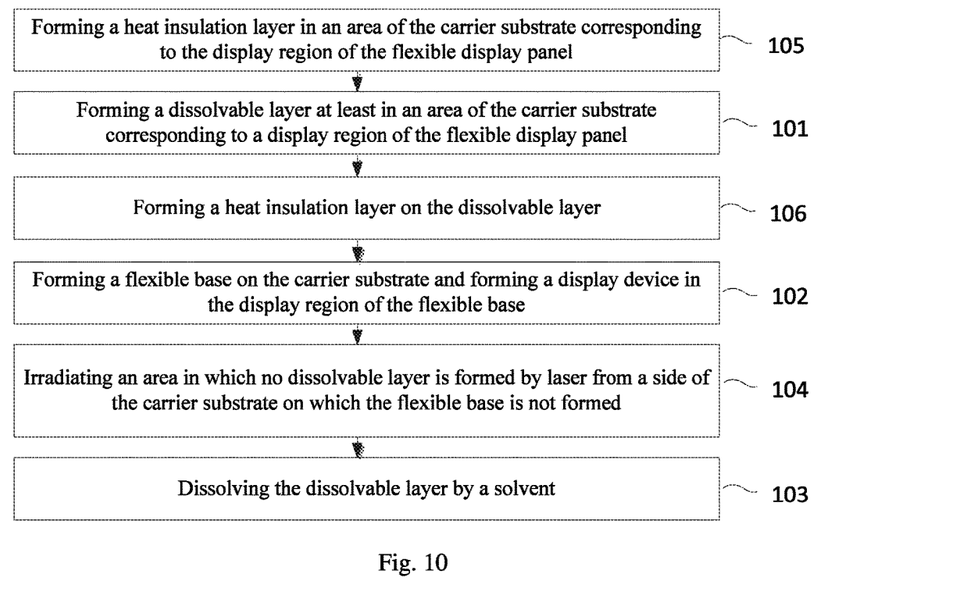
FIG. 10 is an illustrative view of a manufacturing method of flexible display panel according to yet another embodiment of the present disclosure.

In one embodiment of the present disclosure, as illustrated in FIG. 10, after the step 101 and before the step 102, the manufacturing method further comprises a step 106 of forming a heat insulation layer on the dissolvable layer.

The thus-formed flexible display motherboard comprises the heat insulation layer positioned between the dissolvable layer and the carrier substrate and the heat insulation layer positioned between the dissolvable layer and the flexible base, as illustrated in FIG. 3.

Figure 11:
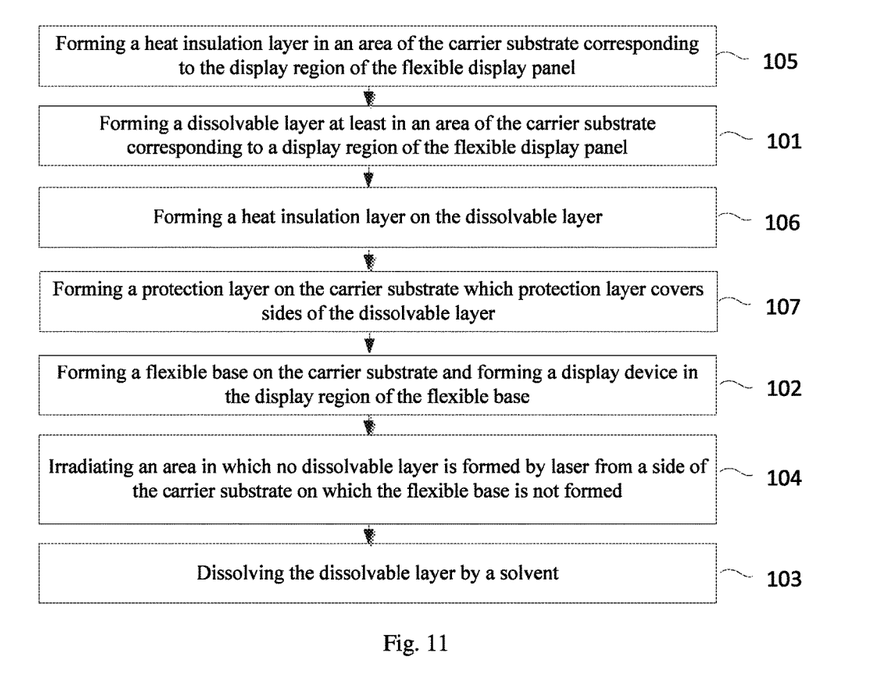
FIG. 11 is an illustrative view of a manufacturing method of flexible display panel according to still another embodiment of the present disclosure.

In one embodiment of the present disclosure, the dissolvable layer is formed in an area corresponding to the display region and a part of the periphery region, and as illustrated in FIG. 11, after the step 101 and before the step 102, the manufacturing method further comprises:

a step of 107 of forming a protection layer on the carrier substrate which protection layer covers sides of the dissolvable layer.

The thus-formed flexible display motherboard is as illustrated in FIG. 4, in which the sides of the dissolvable layer 13 are covered by the protection layer 15.

In this case, the step 104 can be irradiating the protection layer by laser from a side of the carrier substrate in which the flexible base is not formed, so that the protection layer is separated from the carrier substrate. After the protection layer is separated from the carrier substrate, the dissolvable layer can be dissolved by a solvent, so that the flexible display panel is separated from the carrier substrate.

It is to be noted that the manufacturing method of flexible display motherboard according to the embodiment of the present disclosure is only described to illustrate the inventive concept of the present disclosure and is only described in the aspects of preparation of layer structure related to the inventive concept. The flexible display panel includes a plurality of thin films or layer structures. Manufacturing method of the flexible display panel is not described in detail in the present disclosure.

Figure 12:
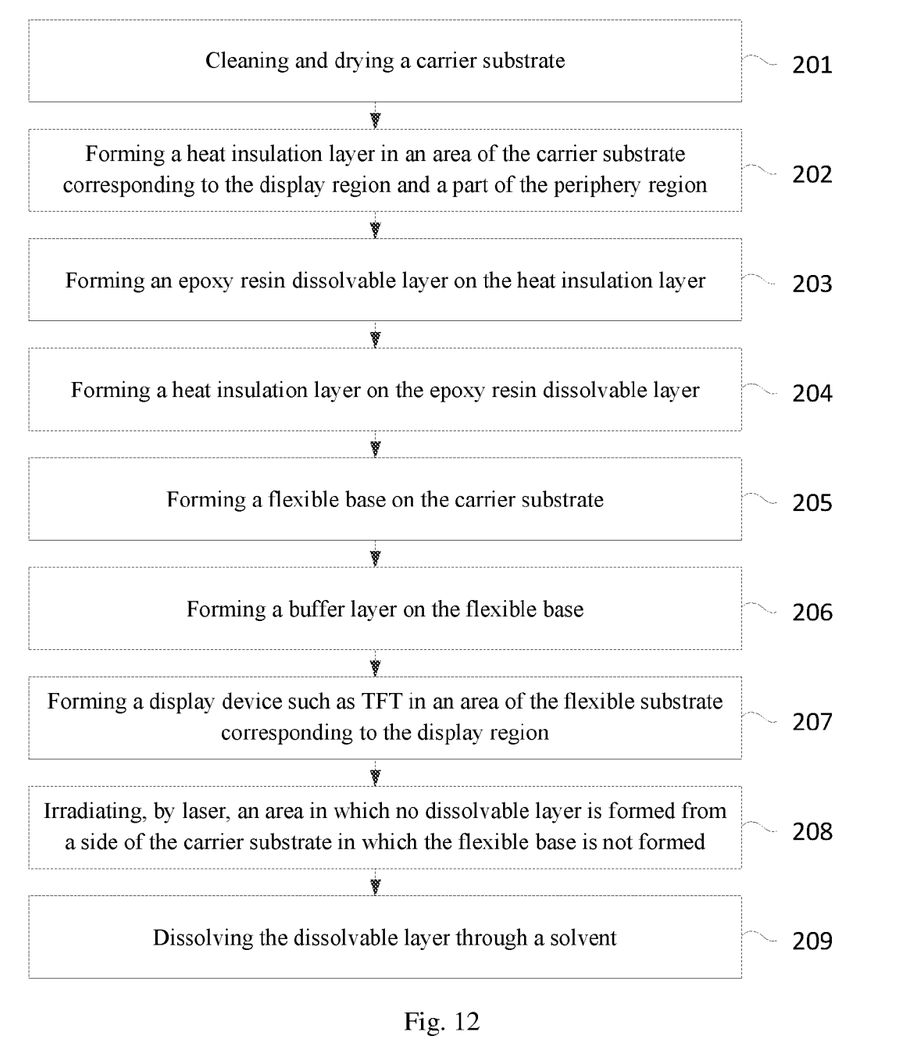
FIG. 12 is an illustrative view of a manufacturing method of flexible display panel according to one embodiment of the present disclosure.

Hereinafter, a manufacturing method of flexible display panel according to the embodiment of the present disclosure is described by way of example. As illustrated in FIG. 12, the manufacturing method comprises:

a step 201 of cleaning and drying a carrier substrate;

a step 202 of forming a heat insulation layer in an area of the carrier substrate corresponding to the display region and a part of the periphery region.

For example, organosilicon, silica sol and the like are prepared into siliceous thermal nanoporous insulation material as the material of the heat insulation layer, by sol-gel method or silica aerogels method. For example, the heat insulation layer can be formed by scratching or spraying. For example, a thickness of the heat insulation layer can be controlled by controlling flow parameters and speed during coating.

The manufacturing method further comprises a step 203 of forming an epoxy resin dissolvable layer on the heat insulation layer.

After forming the epoxy resin dissolvable layer on the heat insulation layer, a heat treatment is performed at 140° C. for one hour so as to cure the epoxy resin.

The manufacturing method further comprises a step 204 of forming a heat insulation layer on the epoxy resin dissolvable layer. The step can be carried out by referring to the step 202.

In one embodiment of the present disclosure, sum of the thicknesses of the dissolvable layer and the heat insulation layer is no greater than 5 microns.

The manufacturing method further comprises a step 205 of forming a flexible base on the carrier substrate.

The flexible base is formed by coating imide onto the carrier substrate on which the dissolvable layer and the heat insulation layer are formed. The thickness of the flexible base can be adjusted in coating by regulating the size of pattern slits. For example, the thickness of the flexible base is 10-12 μm.

The manufacturing method further comprises a step 206 of forming a buffer layer on the flexible base.

A buffer layer formed of silicon nitride, silicon oxide or a composite thereof can be deposited on the flexible base by use of a plasma enhanced chemical vapor deposition apparatus. The thickness of the buffer layer can be typically 1000-3000 angstroms. The buffer layer is mainly configured to reduce the surface roughness of film layers and prevent effects of water and oxygen on the display devices such as TFT which are subsequently prepared.

The manufacturing method further comprises a step 207 of forming a display device in an area of the flexible substrate corresponding to the display region.

The display device comprises a thin film transistor and the like.

The manufacturing method further comprises a step 208 of irradiating, by laser, an area in which no dissolvable layer is formed from a side of the carrier substrate in which the flexible base is not formed, as illustrated in FIG. 7.

Figure 8:
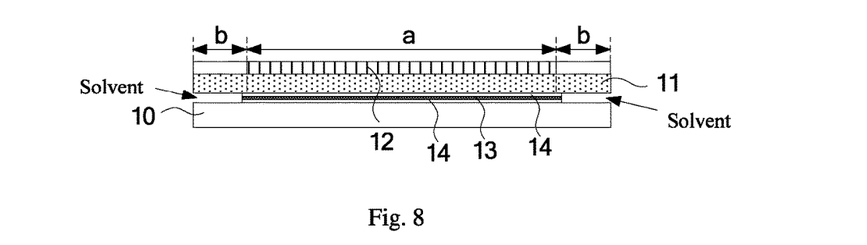
FIG. 8 is an illustrative view of dissolving the dissolvable layer by a solvent.

The manufacturing method further comprises a step 209 of dissolving the dissolvable layer through a solvent, as illustrated in FIG. 8.

After being irradiated by laser, the flexible base and the carrier substrate are separated from each other in the area in which no dissolvable layer is formed. The solvent can become in contact with the dissolvable layer and dissolve the dissolvable layer, so that the flexible display panel is separated from the carrier substrate.

In the manufacturing method of flexible display panel according to the embodiment of the present disclosure, since a dissolvable layer is formed between the flexible base of the flexible display panel and the carrier substrate in an area corresponding to the display region, after the area in which no dissolvable layer is formed is irradiated by laser, the flexible base is separated from the carrier substrate so that the solvent is allowed to be in contact with the dissolvable layer and dissolves the dissolvable layer. Damage to the performance of the light emitting device such as TFT or the like which is caused by the display region being irradiated by laser is prevented.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510276605.8 filed on May 26, 2015, the disclosure of which is hereby entirely incorporated by reference as a part of the present disclosure.

The invention claimed is:

1. A flexible display motherboard, comprising a carrier substrate and a flexible display panel unit formed on the carrier substrate, wherein the flexible display panel unit comprises a flexible base formed on the carrier substrate, and a display region and a periphery region which are positioned on the flexible base, a display device is formed in the display region, and the periphery region surrounds the display region, wherein the flexible display motherboard further comprises a dissolvable layer positioned between the carrier substrate and the flexible base, the dissolvable layer is formed at least in an area corresponding to the display region and is dissolvable in a solvent, wherein the flexible display panel unit further comprising a heat insulation layer positioned between the dissolvable layer and the carrier substrate and/or a heat insulation layer positioned between the dissolvable layer and the flexible base, and wherein the heat insulation layer is formed of nanoporous thermal insulation material.

2. The flexible display motherboard according to claim 1, wherein a sum of thicknesses of the dissolvable layer and the heat insulation layer is no greater than 5 μm.

3. The flexible display motherboard according to claim 2, wherein the dissolvable layer is formed in an area corresponding to the display region and a part of the periphery region.

4. The flexible display motherboard according to claim 2, wherein sides of the dissolvable layer are covered by the flexible base; or the flexible display motherboard further comprises a protection layer which covers at least the sides of the dissolvable layer.

5. The flexible display motherboard according to claim 1, wherein the dissolvable layer is formed in an area corresponding to the display region and a part of the periphery region.

6. The flexible display motherboard according to claim 5, wherein sides of the dissolvable layer are covered by the flexible base; or the flexible display motherboard further comprises a protection layer which covers at least the sides of the dissolvable layer.

7. The flexible display motherboard according to claim 1, wherein sides of the dissolvable layer are covered by the flexible base; or the flexible display motherboard further comprises a protection layer which covers at least the sides of the dissolvable layer.

8. The flexible display motherboard according to claim 1, wherein the dissolvable layer comprises epoxy resin, and components of the solvent comprise dichloromethane, formic acid, phenol and sulfuric acid.

9. The flexible display motherboard according to claim 1, wherein sides of the dissolvable layer are covered by the flexible base; or
the flexible display motherboard further comprises a protection layer which covers at least the sides of the dissolvable layer.

10. A manufacturing method of a flexible display panel, the flexible display panel comprising a flexible base, and a display region and a periphery region which are positioned on the flexible base, the periphery region surrounding the display region, the method comprises:
forming a dissolvable layer at least in an area of a carrier substrate corresponding to the display region in which the flexible display panel is formed, wherein the dissolvable layer is dissolvable in a solvent;
forming the flexible base on the carrier substrate and a display device positioned in the display region, wherein the flexible base covers at least an upper surface of the dissolvable layer; and
dissolving the dissolvable layer by the solvent; and
wherein after forming a dissolvable layer in an area of a carrier substrate corresponding to the display region in which the flexible display panel is formed and before forming the flexible base on the carrier substrate and a display device positioned in the display region, the method further comprises forming a heat insulation layer on the dissolvable layer,
wherein before forming a dissolvable layer in an area of a carrier substrate corresponding to the display region in which the flexible display panel is formed, the method further comprises:
forming a heat insulation layer in the area of the carrier substrate corresponding to the display region in which the flexible display panel is formed; and
forming a dissolvable layer in an area of a carrier substrate corresponding to the display region in which the flexible display panel is formed is forming the dissolvable layer on the heat insulation layer, and
wherein the heat insulation layer is formed of nanoporous thermal insulation material.

11. The manufacturing method according to claim 10, wherein the dissolvable layer is formed in the display region and in a part of the periphery region; after forming the flexible base on the carrier substrate and a display device positioned in the display region and before dissolving the dissolvable layer by use of the solvent, the method further comprises:
irradiating an area of the flexible display panel in which no dissolvable layer is formed by laser from a side of the carrier substrate on which the flexible base is not formed.

12. The manufacturing method according to claim 10, wherein the dissolvable layer is formed in the display region and in a part of the periphery region; before forming the flexible base on the carrier substrate and a display device positioned in the display region, the method further comprises:
forming a protection layer on the carrier substrate, the protection layer covering at least sides of the dissolvable layer;
irradiating an area of the flexible display panel in which no dissolvable layer is formed by laser from a side of the carrier substrate on which the flexible base is not formed is irradiating the protection layer by laser from a side of the carrier substrate on which the flexible base is not formed.

13. The manufacturing method according to claim 10, wherein the dissolvable layer comprises epoxy resin, and components of the solvent comprise dichloromethane, formic acid, phenol and sulfuric acid.

14. The manufacturing method according to claim 10, wherein a sum of thicknesses of the dissolvable layer and the heat insulation layer is no greater than 5 μm.

* * * * *